US006270355B1

(12) United States Patent
Kihara

(10) Patent No.: US 6,270,355 B1
(45) Date of Patent: *Aug. 7, 2001

(54) LAMP BULB DEVICE INSTALLED ON BOARD

(75) Inventor: Ujiyasu Kihara, Ehime-ken (JP)

(73) Assignee: Harison Toshiba Lighting Co., Ltd., Ehime-ken (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/452,485

(22) Filed: Dec. 1, 1999

Related U.S. Application Data

(62) Division of application No. 09/167,213, filed on Oct. 6, 1998.

(30) Foreign Application Priority Data

Feb. 28, 1998 (JP) .................................................. 10-90577

(51) Int. Cl.[7] .............................. H01R 12/00; H05K 1/00

(52) U.S. Cl. ............................................................... 439/56

(58) Field of Search ......................... 439/56, 57; 362/255

(56) References Cited

U.S. PATENT DOCUMENTS 4,299,430 * 11/1981 Baba et al. ............................ 439/57
4,943,898 * 7/1990 Weenink .............................. 362/226
5,061,189 * 10/1991 Iio et al. ............................... 439/57
5,212,345 * 5/1993 Gutierrez ............................ 174/52.5
5,760,669 * 6/1998 Dangler et al. ......................... 336/65
5,927,998 * 7/1999 Hino et al. ............................. 439/57
6,005,465 * 12/1999 Kronenberg et al. ................ 336/192

FOREIGN PATENT DOCUMENTS 03088262 4/1991 (JP) .
05029048 2/1993 (JP) .
08102350 4/1996 (JP) .
08222188 8/1996 (JP) .
08315785 11/1996 (JP) .
08315937 11/1996 (JP) .
08334388 12/1996 (JP) .
09055271 2/1997 (JP) .
09274895 10/1997 (JP) .
10162917 6/1998 (JP) .

* cited by examiner

*Primary Examiner*—Tulsidas Patel
*Assistant Examiner*—Brian S. Webb
(74) *Attorney, Agent, or Firm*—Knobbe, Marten, Olson & Bear, LLP

(57) ABSTRACT

A lamp bulb device includes a non-capped lamp bulb (9) having lead wires (12) and a base portion supporting a cylindrical bottomed holder (29) and having lead-wire outlet holes (5). The lead wires (12) drawn out through the lead-wire outlet holes (5) are extended through lead-wire guide grooves (25) which are formed on a lower surface of the base portion, lead wires are extended from the lead-wire guide grooves (25) to lead-wire winding portions (32), and lead wire portions wound around the lead-wire winding portions (32) are connected electrically to lands (14) of a circuit board by soldering. The electrical connection is secured.

2 Claims, 11 Drawing Sheets

LAMP BULB DEVICE INSTALLED ON BOARD

This application is a divisional of patent application Ser. No. 09/167,213 filed Oct. 6, 1998.

BACKGROUND OF THE INVENTION

1. Field of the Invention

This invention relates to a lamp bulb device installed on a board, in which lead wires of a non-capped lamp bulb are connected to lands of a printed wiring board by soldering to install the lamp bulb device on the printed wiring board, and more particularly, to a lamp bulb device installed on a board, in which lead wires of the lamp bulb device are connected to lands of a printed wiring board by soldering according to either flow soldering means or reflow soldering means.

2. Description of the Prior Art

A lamp bulb device installed on a board of this kind in a prior art is configured such that a lamp holder is formed on an upper surface of the device as one body, and lead wires exposed to the outside through a side surface end of a base are connected to lands of a printed wiring board by soldering as disclosed in Japanese Utility Model Publication (kokoku) No. Hei 5-11649 (1993), or otherwise, that a squeezed seal portion of a non-capped lamp bulb is inserted into a substantially rectangular parallelepiped-shaped base having a lamp insertion hole having an open top, and lead wires exposed to the outside through a side surface of the base are pressed in a flat shape to extend parallel to a bottom of the base and are then connected to lands of a printed wiring board by soldering as disclosed in Japanese Utility Model Laid-open (kokai) No. Hei 3-94763 (1991).

The lamp bulb device installed on the board as described in the prior art has the problems that since terminals of the lamp bulb device and lands are connected together by soldering on the outside of the side surface of the base, the lamp bulb device is packaged without being in contact with the base portion, and as a result, packaging density is lowered, while a short soldered portion of the lead wire degrades reliability in connection.

SUMMARY OF THE INVENTION

An object of the present invention, which may be defined in embodiments 1 to 9, is to improve packaging density by adapting a bottom of a base portion for a connection portion, and another object of the present invention, which may be defined in embodiments 1 to 11, is to provide more secure connection by enlarging an area of the connection portion.

According to the present invention as defined in embodiment 1, there is provided a lamp bulb device installed on a board, composed of a non-capped lamp bulb having lead wires and a base portion for supporting a cylindrical bottomed holder (the bottom is a part of the base portion) having a lamp insertion hole (the interior of the holder) permitting insertion of the non-capped lamp bulb therein and structured such that lead-wire outlet holes are provided substantially in the center of the base portion to draw out the lead wires toward a lower surface of the base portion, and the lead wires drawn out through the lead-wire outlet holes are connected electrically to lands of a printed wiring board by soldering, wherein lead-wire guide grooves (recesses) are provided on the lower surface of the base portion to communicate with the lead-wire outlet holes, lead-wire insertion grooves (recesses) are provided on a side surface of the base portion to communicate with the lead-wire guide grooves, lead-wire fixing grooves (recesses) (respectively having open tops permitting lead-in of the lead wires, for example) are provided on the inside of the base portion to communicate with the lead-wire insertion grooves, the lead wires drawn out from the non-capped lamp bulb through the lead-wire outlet holes are led to the lead-wire fixing grooves through the lead-wire guide grooves after passage through the lead-wire insertion grooves, and the lead wire portions within the lead-wire guide grooves are connected electrically to the lands of the printed wiring board by soldering.

According to the present invention as defined in embodiment 2, when an outer edge of each lead-wire guide groove is cut to provide an upward hollow step portion, molten solder is allowed to be wet along a side surface of each lead wire upwards in case of soldering according to reflow soldering means, resulting in more firm connection.

The lead wire is positioned along the center line of each lead-wire guide groove on condition that a width $W_1$ of each lead-wire guide groove and a width W2 of each insertion groove are determined to satisfy $W_2<W_1$, and a width D of each lead wire is determined to satisfy $W_1 \geqq 2D$.

According to the present invention as defined in embodiment 4, the length of lead wires used is reduced by forming the lead-wire fixing grooves as grooves opening to the left and right side surfaces of the base portion, resulting in a reduction of device cost.

According to the present invention as defined in embodiment 5, when the lead wires within the lead-wire guide grooves are pressed in a flat belt-like shape and are then dipped into molten solder, the solder stands up above the center of the lead wires, providing a plating thickness of about 10 microns. Further, a melting speed of solder is improved by the use of a linear groove provided on the surface to be coated with solder.

According to the present invention as defined in embodiment 8, it is possible to obtain satisfactory solderability on condition that a depth H of each lead wire guide groove, a thickness T of each lead-wire guide groove, a thickness T of each lead-wire within the lead-wire guide groove and a thickness t of cream solder printed on the land of the printed wiring board are determined to satisfy $H \leqq T+t/2$.

According to the present invention as defined in embodiment 9, leg pieces may be provided opposite to each other through the lead wires at an interval larger than a width of each lead-wire insertion groove on the lower surface of the flat base portion without providing the lead-wire guide grooves on the lower surface of the base portion.

According to the present invention as defined in embodiment 10, there is provided a lamp bulb device installed on a board and composed of a non-capped lamp bulb having lead wires and a base portion for supporting a cylindrical bottomed holder (the bottom is a part of the base portion) having a lamp insertion hole (the interior of the holder) permitting insertion of the non-capped lamp bulb, wherein lead-wire outlet holes are provided substantially in the center of the base portion to draw out the lead wires toward the lower surface of the base portion, a pair of projections are provided in a sideward projecting shape on both the left and right sides of the base portion, lead-wire fixing grooves are provided on the lower surface of the base portion to fix the lead wires drawn around the lower surface side from the outside corners of the projections, the lead wires drawn out through the lead-wire outlet holes are laid between the projections through the lower surface of the base portion, and lead wire portions are laid between the projections are connected electrically to lands of a printed wiring board by soldering.

According to the present invention as defined in embodiment 11, there is provided a lamp bulb device installed on a board and composed of a non-capped lamp bulb having lead wires and a cylindrical bottomed holder (the bottom is a part of the base portion) having a lamp insertion hole (the interior of the holder) permitting insertion of the non-capped lamp bulb and lead-wire outlet holes provided in a bottom surface, wherein a pair of flanges are provided opposite to each other at symmetrical positions on the side of the lower circumference of the cylindrical bottomed holder, lead-wire winding portions are provided respectively on the flanges to extend in directions opposite to each other, the lead wires drawn out from the non-capped lamp bulb are led from the lower surface side of the flange portions and are then wound around the lead-wire winding portions, and lead wire portions wound around the lead-wire winding portions are connected electrically to lands of a printed wiring board by soldering.

The foregoing and other objects and features of the invention will become apparent from the following description of preferred embodiments of the invention with reference to the accompanying drawings.

DETAILED DESCRIPTION OF THE PREFERRED EMBODIMENTS

Figure 1:
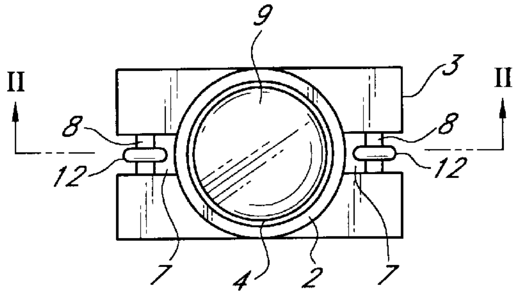
FIG. 1 is a plan view showing a first embodiment of a lamp bulb device installed on a board according to the present invention.
Figure 2:
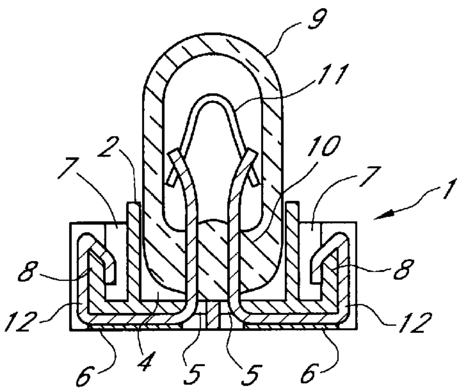
FIG. 2 is a sectional view taken along a line II—II in FIG. 1.
Figure 3:
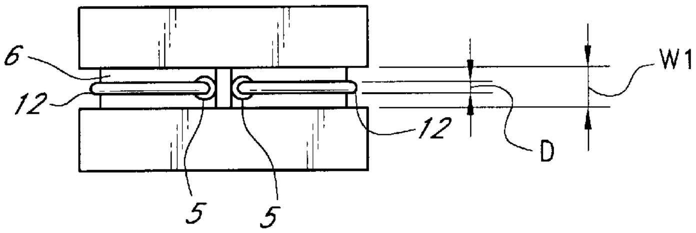
FIG. 3 is a bottom view of FIG. 1.
Figure 4:
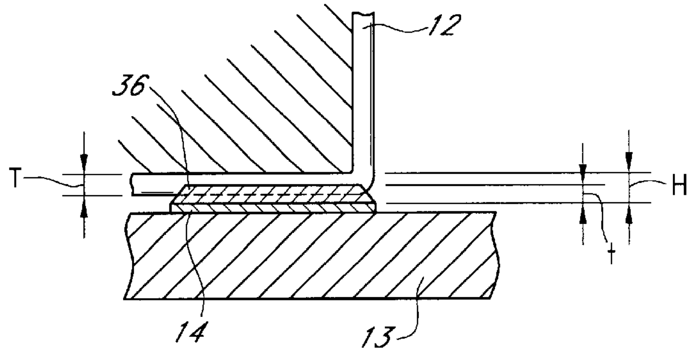
FIG. 4 is a view for explaining the relation between a lead-wire guide groove and a lead wire.

According to an embodiment shown in FIGS. 1 to 5, a miniature lamp socket 1 is made of a thermoplastic and insulating synthetic resin, for instance, and comprises a cylindrical bottomed holder 2 and a substantially rectangular parallelepiped-shaped base portion 3 which are formed as one body.

The cylindrical bottomed holder 2 has a lamp insertion hole 4 having an open top, and lead-wire outlet holes 5 are provided in a bottom wall of the holder to extend through the bottom wall vertically.

The base portion 3 is provided on the outside of a lower portion of the cylindrical bottomed holder 2 and has a substantially rectangular parallelepiped shape having a longitudinal width equal to an outer diameter of the cylindrical bottomed holder 2 and a lateral width greater than the longitudinal width.

Lead-wire guide grooves (recesses) 6 are provided in a concave shape on a lower surface of the base portion 3 to extend from the lead-wire outlet holes 5 to the left and right sides. Lead-wire fixing grooves (recesses) 7 are formed on the left and right sides of the cylindrical bottomed holder 2. That is, the lead-wire fixing grooves 7 are formed respectively in spaces enclosed by upright walls 8 continuous to the base portion 3 and the outside surface of the cylindrical bottomed holder 2. The upper ends of the upright walls 8 are located lower than the upper surface of the base portion 3 and are formed as tapered surfaces inclined downwards to the inner side.

A squeezed seal portion 10 of a non-capped lamp bulb 9 is inserted into the lamp insertion hole 4 of the cylindrical bottomed holder 2. The non-capped lamp bulb 9 includes a glass bulb containing a filament 11, which is supported by a pair of lead wires 12. The lead wires 12 extend airtightly through the squeezed seal portion 10 formed on one end of the glass bulb and are then drawn out to the outside, and power may be supplied to the filament 11 through the outside lead wires 12. A dumet wire having a wire diameter of about 0.2 to 0.5 mm is available for the lead wires 12.

The squeezed seal portion 10 of the non-capped lamp bulb 9 described above is inserted into the lamp insertion hole 4 of the cylindrical bottomed holder 2, and the lead wires 12 are inserted into the lead wire outlet holes 5 provided in the bottom wall of the lamp insertion hole 4 and are drawn out toward the lower surface of the miniature lamp socket 1. The drawn-out lead wires 12 are led to the lead-wire fixing grooves 7 through the lead-wire guide grooves 6 in the manner of causing the lead wires to extend along the outside surfaces of the upright walls 8 toward their upper ends and subsequently along the upper-end tapered surfaces of the upright walls 8, and are consequently attached to the inside surfaces of the upright walls 8 in a fixed state.

Since the lead wires 12 extending through the lead-wire guide grooves 6 formed on the lower surface of the miniature lamp socket 1 serve as terminals connected to lands 14 of a printed wiring board 13 (described later) by soldering, a width $W_1$ of each of the guide grooves 6 is set to be twice or more the wire diameter (width) D of each of the lead wires 12 for the purpose of attaining satisfactory wettability and solder adhesiveness. Further, assuming that a depth of each of the lead-wire guide grooves 6 is represented by H, a thickness (wire diameter) of each of the lead wires 12 is represented by T and a thickness of cream solder 36 printed on the land 14 of the printed wiring board 13 is represented by t, the lead-wire guide grooves are formed to satisfy $H \leqq T+t/2$ for the purpose of attaining satisfactory solderability.

The miniature lamp socket 1 equipped with the non-capped lamp bulb 9 is installed on the printed wiring board 13. The cream solder 36 is printed on the lands 14 of the printed wiring board 13. The lamp bulb device installed on the board is mounted on the printed wiring board 13 so that the lead wires 12 within the lead-wire guide grooves 6 correspond to the lands 14. Then, the lamp bulb device is passed through a reflow furnace in this state to melt the solder 36 on the lands 14, and the lamp bulb device and the printed wiring board 13 are fixed to each other by means of reflow soldering effective in connecting the lead wires 12 electrically to the lands 14 by soldering.

Figure 5:
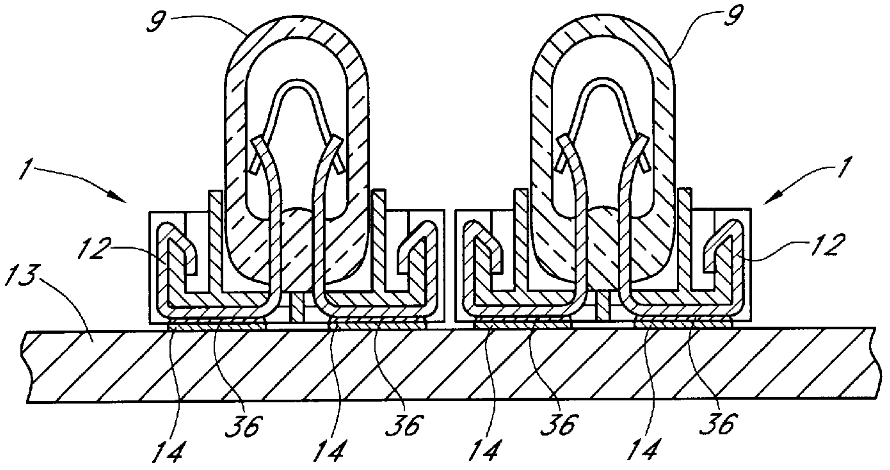
FIG. 5 is a longitudinal sectional view showing the state of lamp bulb devices installed on a printed wiring board.

Since the lead wires 12 are drawn around the lead-wire fixing grooves 7 from the lower surface of the miniature lamp socket 1 before fixing, the lead wires 12 are fixed surely to the miniature lamp socket 1 without movement. That is, there is no fear of defective soldering caused by dispersion of the lead wire position (soldered terminal), and electrical connection is made without fail. Further, since a structure of soldering the lower surface of the miniature lamp socket 1 is adopted, it becomes possible to improve the packaging density as shown in FIG. 5.

Figure 6:
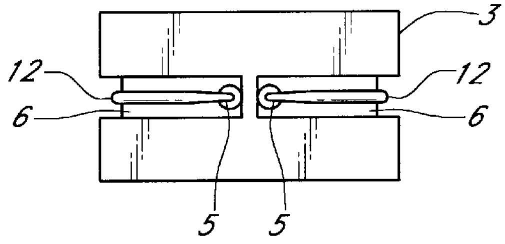
FIG. 6 is a bottom view showing another embodiment.
Figure 7:
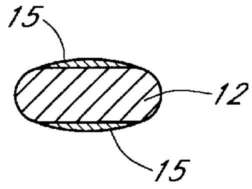
FIG. 7 is a sectional view showing a soldered lead wire.

A description will now be given of an embodiment shown in FIGS. 6 and 7. FIG. 6 is a bottom view showing a lamp bulb device installed on a board, and FIG. 7 is a sectional view showing a lead wire within a lead-wire guide groove. Each of the lead wires 12 located within the lead-wire guide grooves 6 has a flat shape having a thickness of about 0.15 mm and is provided with a solder coating 15 on the surface. A dumet wire having a substantially circular section with a wire diameter of 0.2 to 0.5 mm is available for the lead wires 12 of the non-capped lamp bulb 9. Thus, the lead wires are in linear contact in case of soldering, resulting in a degradation of connectivity. In this connection, the lead wires 12 are pressed up to a thickness of about 0.15 mm into a flat thin belt-like shape and, thereafter, are dipped into the molten solder to form the solder coating (plating) 15 on the surfaces of the lead wires 12. When the lead wires are dipped into the molten solder to form the solder coating 15, the solder stands up above the flat surfaces of the lead wires 12 by the action of surface tension of the solder providing a plating thickness of about 10 microns. By the use of the lead wires 12 formed flatly in this manner, a wider contact surface is provided to enable sure connection, while the solder coating 15 on the lead wires 12 and the solder for use in reflow soldering carried out to install the lamp bulb device on the printed wiring board 13 may be made equal in composition to each other and, therefore, may be melted at the same temperature in soldering to enable excellently reliable connection by soldering. Another configuration is quite similar to that of the above embodiment shown in FIGS. 1 to 5.

Figure 8:
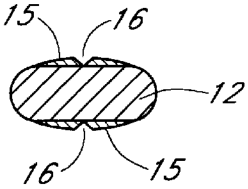
FIG. 8 is a sectional view showing another soldered lead wire.

A description will now be given of an embodiment shown in FIG. 8. FIG. 8 is a sectional view showing a lead wire within a lead-wire guide groove. Referring to FIG. 8, linear grooves 16 having a V-shaped section are formed longitudinally on substantially center portions of the solder coatings 15 formed on the upper and lower flat surfaces of the lead wires 12. Linear grooves of every possible shape such as a concave shape may be applied to the linear grooves 16 without being limited to the linear grooves having a V-shaped section. By the use of the linear grooves 16 formed on the solder coatings 15 in this manner, the solder begins melting from these groove portions, and melting of the solder in other positions is accelerated to enable more highly reliable connection by soldering.

Figure 9:
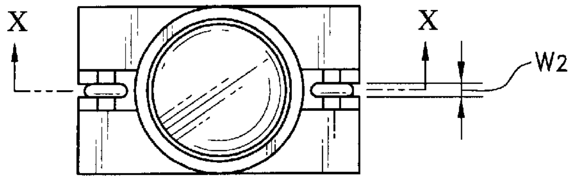
FIG. 9 is a plan view showing a further embodiment.
Figure 10:
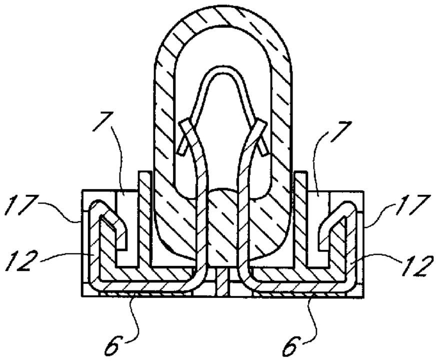
FIG. 10 is a sectional view taken along a line X—X in FIG. 9.
Figure 11:
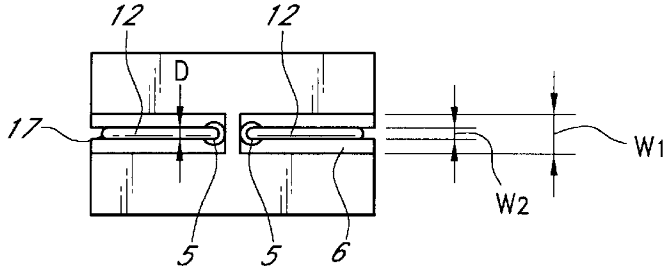
FIG. 11 is a bottom view of FIG. 9.

A description will now be given of an embodiment shown in FIGS. 9 to 11. Lead-wire insertion grooves (recesses) 17 opening respectively to the left and right sides are formed on the outside surfaces of the upright walls 8 to communicate with the lead-wire guide grooves 6. The lead-wire insertion grooves 17 extend vertically from the center positions of the lead-wire guide grooves 6, and a width $W_1$ of each of the lead-wire guide grooves 6 is set to be greater than a width $W_2$ of each of the lead-wire insertion grooves 17 so that lead wires 12 within the lead-wire guide grooves 6 may pass along the center lines of the lead-wire guide grooves 6. The lead wires 12 are led to the lead-wire fixing grooves 7 after passage through the lead-wire guide grooves 6 and the lead-wire insertion grooves 17. Another configuration is quite similar to that of the above embodiment shown in FIGS. 1 to 5.

Figure 12:
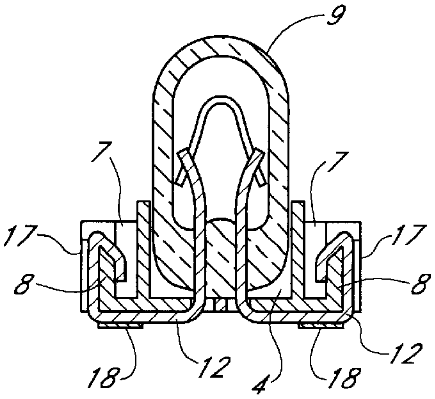
FIG. 12 is a sectional view showing still a further embodiment.
Figure 13:
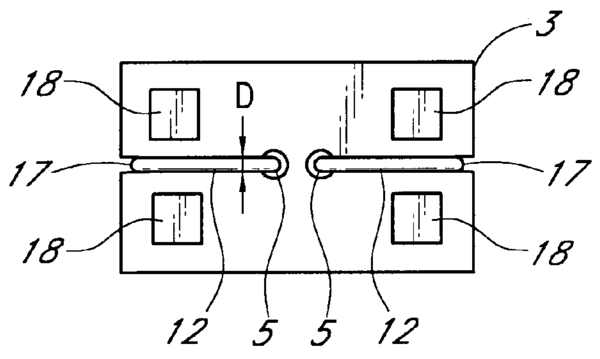
FIG. 13 is a bottom view of FIG. 12.

A description will now be given of an embodiment shown in FIGS. 12 and 13. The lower ends of the lead-wire outlet holes 5 are opened to the lower surface of the base portion 3, and two pairs of leg pieces 18 are provided on the lower surface of the base portion 3. It is necessary that each pair of leg pieces 18 are positioned to be axially symmetrical about the lead wires 12 and that an interval between the leg pieces 18 opposite to each other through each lead wire 12 is twice or more that wire diameter (width) D of each of the lead wires 12. By the use of the pair of leg pieces 18 provided on the flat lower surface of the miniature lamp socket 1 symmetrically about each lead wire 12 at an interval twice or above as much as the wire diameter of each lead wire 12 as described above, these leg pieces may fulfill a function similar to that of the lead-wire guide grooves 6 without providing the lead-wire guide grooves 6 in a concave shape like the socket shown in FIGS. 1 to 5 and 9 to 11. Another configuration is quite similar to that of the above embodiment shown in FIGS. 9 to 11.

Figure 14:
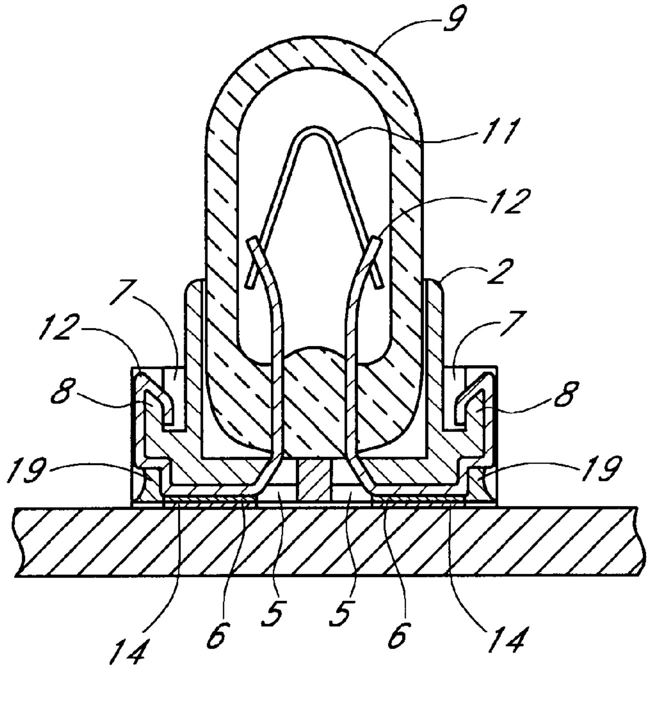
FIG. 14 is a sectional view showing yet a further embodiment.
Figure 15:
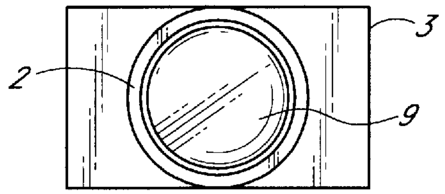
FIG. 15 is a plan view showing yet a further embodiment.
Figure 16:
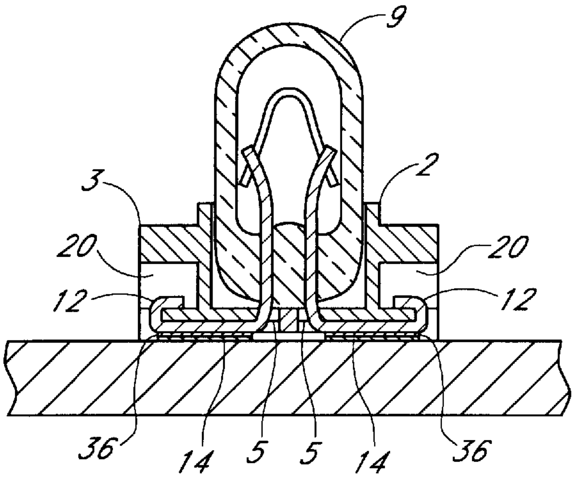
FIG. 16 is a sectional view showing the state of a lamp bulb device installed on a printed wiring board.
Figure 17:
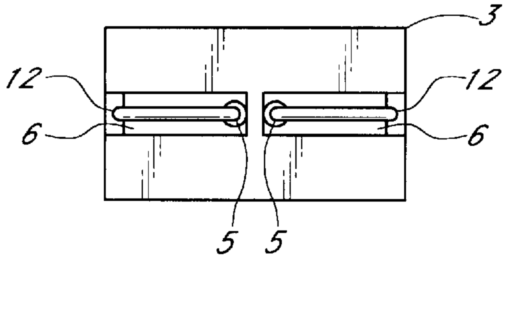
FIG. 17 is a bottom view of FIG. 15.
Figure 18:
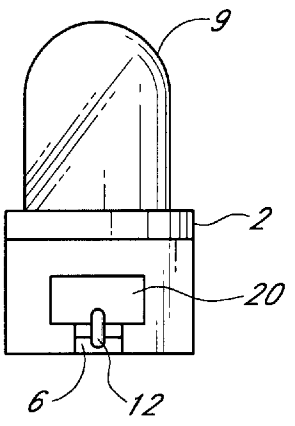
FIG. 18 is a side view of FIG. 15.
Figure 19:
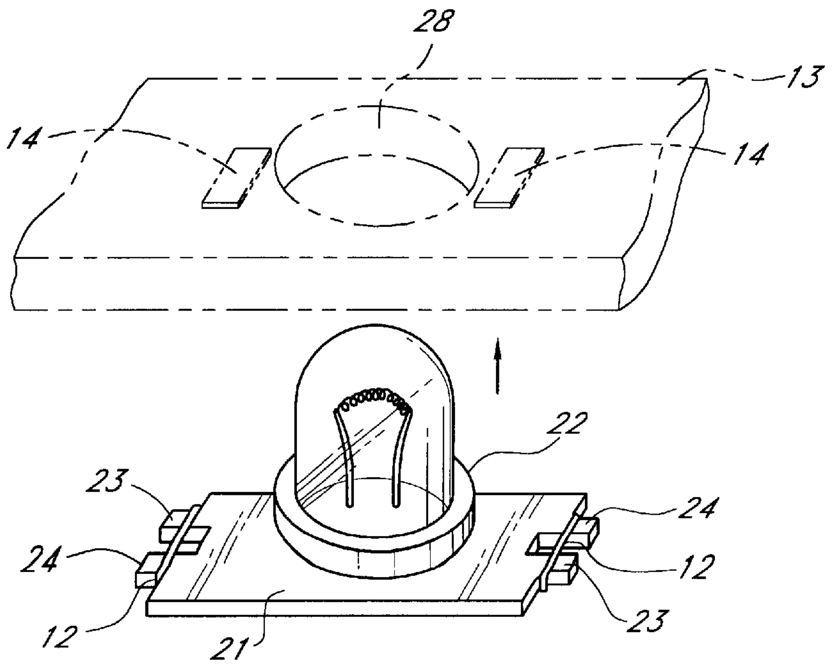
FIG. 19 is a perspective view showing a lamp bulb device and a printed wiring board in an exploded state according to yet a further embodiment.
Figure 20:
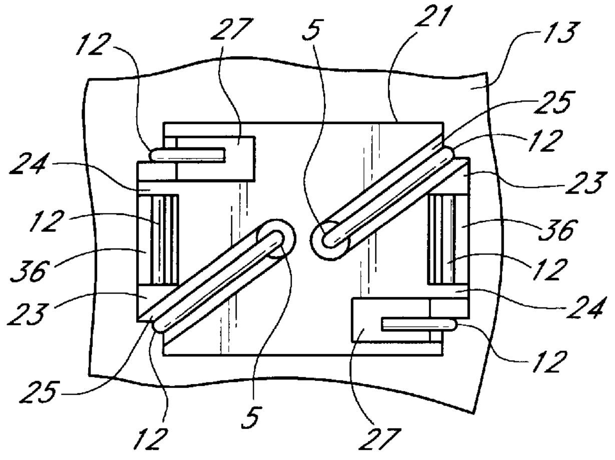
FIG. 20 is a bottom view showing the state of a lamp bulb device installed on a printed wiring board.
Figure 21:
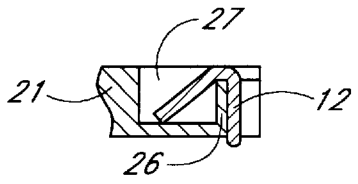
FIG. 21 is a sectional view for explaining the state of a lead wire fixed to a lead-wire fixing groove.
Figure 22:
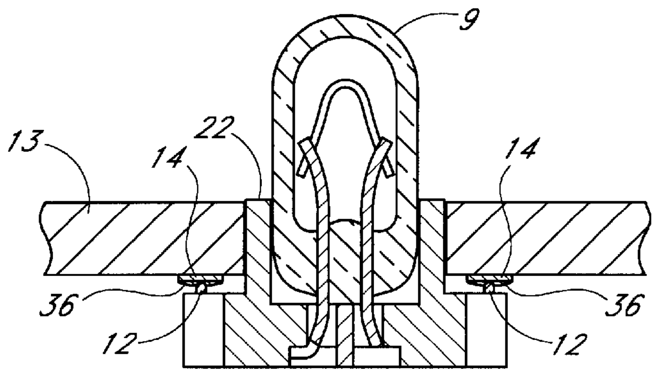
FIG. 22 is a sectional view showing the state of a lamp bulb device installed on a printed wiring board.
Figure 23:
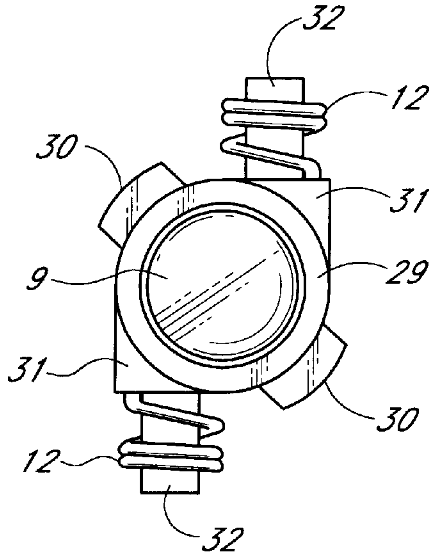
FIG. 23 is a plan view showing yet a further embodiment.
Figure 24:
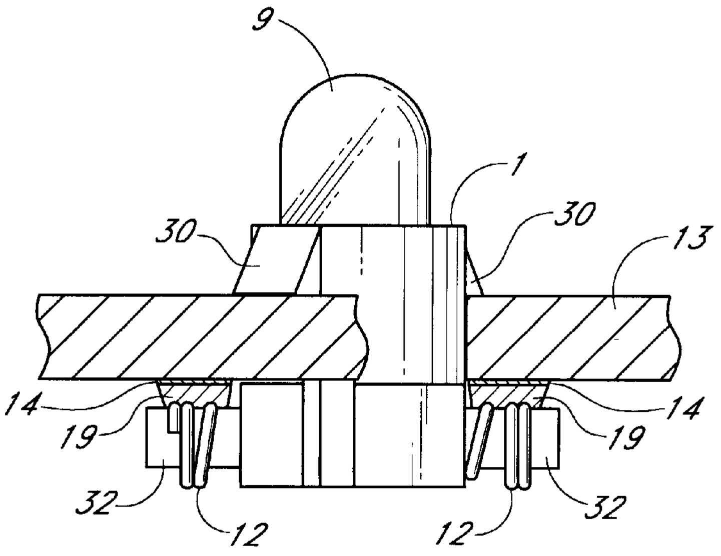
FIG. 24 is a side view for explaining a printed wiring board in an installed state.
Figure 25:
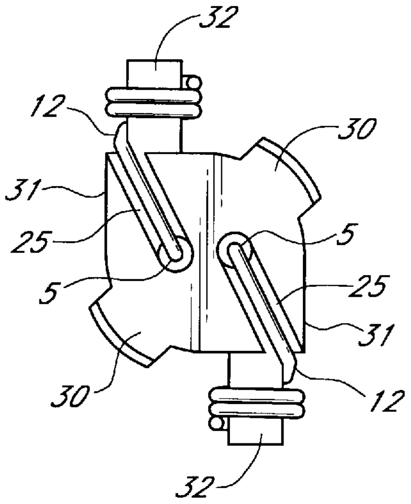
FIG. 25 is a bottom view of FIG. 23.

A description will now be given of an embodiment shown in FIG. 14. The left and right ends of the lead-wire guide grooves 6 are cut inward and upwards to provide hollow portions in a step-like shape. Another configuration is quite similar to that of the above embodiment shown in FIGS. 1 to 5. When the lead wires 12 are drawn out through the lead-wire outlet holes 5 and are then caused to extend along the bottoms of the lead-wire guide grooves 6, the lead wires 12 are bent inward along the step-shaped hollow portions formed on the left and right ends of the lead-wire guide grooves 6 and are further led to the lead-wire fixing grooves 7 through the upright walls 8. In case of soldering according to reflow soldering means, molten solder 19 is caused to be wet along the side surfaces of the lead wires 12 upwards, resulting in firm connection by soldering.

A description will now be given of an embodiment shown in FIGS. 15 to 18. The lead-wire outlet holes 5 are provided in the bottom walls of the cylindrical bottomed holder 2 having the lamp insertion hole 4, and the lead-wire guide grooves 6 communicating with the lead-wire outlet holes 5 are provided to extend in left and right directions on the lower surface of the substantially rectangular parallelepiped-shaped base portion 3 provided on the outside of a lower portion of the cylindrical bottomed holder 2. Lead-wire fixing grooves (recesses) 20 opening to the left and right sides of the base portion 3 form a space of a channel-shaped longitudinal section enclosed by the outside surface of the cylindrical bottomed holder 2 and the upper and lower surfaces of the base portion 3. The lead-wire fixing grooves 20 may communicate with each other through the side walls of the cylindrical bottomed holder 2. The lead wires 12 are led to the lead-wire fixing grooves 20 through the lead-wire outlet holes 5 after the passage through the lead-wire guide grooves 6 and are then fixed to the lead-wire fixing grooves.

When the lead wires 12 are led to the lead-wire fixing grooves 20 opening to the left and right sides of the base portion 3 and are then fixed thereto, the length of each of the lead wires 12 may be reduced in comparison to a method of leading the lead wires 12 around up to the upper surface of the base portion 3, resulting in a reduction of cost. The lead wires 12 are not exposed to the outside through the base portion 3, so that even if other components mounted on the printed wiring board come into contact with the lamp bulb device, the lead wires are not in danger of being in contact with the other components, and as a result, no short circuit is caused in an electronic circuit. Further, similarly to the above embodiment shown in FIGS. 1 to 5, the lead wires 12 are fixed in position and, therefore, may be firmly connected to the printed wiring board at the fixed soldering position without defective soldering.

A description will now be given of an embodiment shown in FIGS. 19 to 22. In FIGS. 19 to 22, reference numeral 21 denotes a base portion having a cylindrical bottomed holder 22 formed on its upper surface as one body, and this base portion is formed wider than the cylindrical bottomed holder 22 for the purpose of installing the lamp bulb device stably on the printed wiring board. A pair of projections 23, 24 are provided respectively on the left and right edges of the base portion 21 to project outward to the left and right sides. In the base portion 21, its left and right edges located between the projections 23, 24 are cut inwardly. By the use of the inwardly cut portions formed between the projections 23, 24 as described above, the positions of the lead wires 12 may be easily confirmed visually when the lead wires 12 are laid between the upper surfaces of the projections 23, 24, while satisfactory heat conduction enables sure connection by soldering. The lead-wire outlet holes 5 are provided in the lower surface of the base portion 21 to communicate with the lamp insertion hole 4, and lead-wire guide grooves (recesses) 25 are formed along a diagonal line to communicate with these lead-wire outlet holes 5. That is, the lead-wire guide grooves 25 extend from the lead-wire outlet holes 5 to the outside corners of the projections 23. Lead-wire fixing grooves (recesses) 27 having hang-up pieces 26 for hanging up the lead wires are provided in a concave shape on the lower surface of the base portion 21. Each of the hang-up pieces 26 is formed to be smaller than a length resulting from subtracting a wire diameter (thickness) of each of the lead wires 12 from the thickness of the base portion 21.

The squeezed seal portion 10 of the non-capped lamp bulb 9 is inserted into the lamp insertion hole 4 of the cylindrical bottomed holder 2, and the lead wires 12 are drawn out through the lead-wire outlet holes 5 toward the lower surface. The lead wires 12 are laid from the upper surfaces of the projections 23 to the upper surfaces of the projections 24 through the lead-wire guide grooves 25 in the manner of hanging the lead wires on the outside corners of the diagonally provided projections 23 and subsequently the outside corners of the projections 24. Then, the lead wires are led to the lead-wire fixing grooves 27 in the manner of extending the lead wires along the outside surfaces of the hang-up pieces 26, and are fixed to the lead-wire fixing grooves.

The printed wiring board 13 has an installing hole 28 permitting insertion of the cylindrical bottomed holder 22 therein. Further, cream solder 36 is printed on the lands 14 provided on the back surface of the printed wiring board 13. The cylindrical bottomed holder 22 of the lamp bulb device installed on the board is inserted into the installing hole 28 of the printed wiring board 13 from its back side to expose a luminous portion to the surface of the printed wiring board 13, and the printed wiring board 13 is mounted on the upper surface of the base portion 21 so that the lands 14 correspond to the lead wires 12 laid between the upper surfaces of the projections 23, 24. Thereafter, the lamp bulb device is connected and fixed to the printed wiring board 13 by means of reflow soldering. It is possible to make sure of leading the lead wires 12 around the upper surface of the base portion 21 by a simple structure, and a wide soldering area may be provided, while no defective soldering is caused.

A description will now be given of an embodiment shown in FIGS. 23 to 26. A pair of fixing projections 30 are provided opposite to each other at exactly symmetrical positions on the circumference of a cylindrical bottomed holder 29 having a lamp insertion hole 4 having an open top, a pair of flanges 31 are provided opposite to each other at exactly symmetrical positions on the lower circumference of the cylindrical bottomed holder, and lead-wire winding portions 32 made of an insulating and elastic member are formed on the flanges 31 as one body to project in directions opposite to each other. Lead-wire guide grooves 25 are provided in a concave shape on the bottom wall of the miniature lamp socket 1 to extend from the lead-wire outlet holes 5 to the outside corners of base portions of the lead-wire winding portions 32.

The lead wires 12 drawn out from the non-capped lamp bulb 9 through the lead-wire outlet holes 5 are led to the lead-wire winding portions 32 through the lead-wire guide grooves 25, are then drawn around the upper surfaces of the lead-wire winding portions 32 and are subsequently wound at least once around the lead-wire winding portions 32 from the upper surface side thereof, providing soldered terminals. The more the wire is wound, the more the reliability of soldering is improved.

Figure 26:
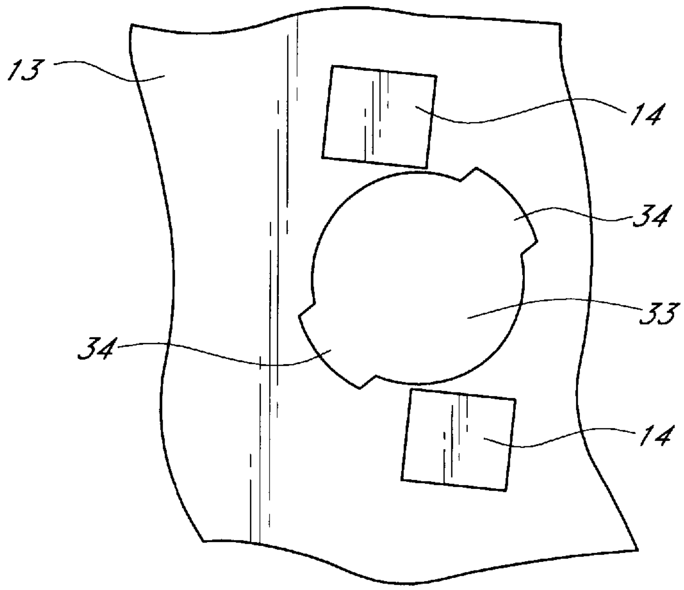
FIG. 26 is a rear view showing a printed wiring board.
Figure 27:
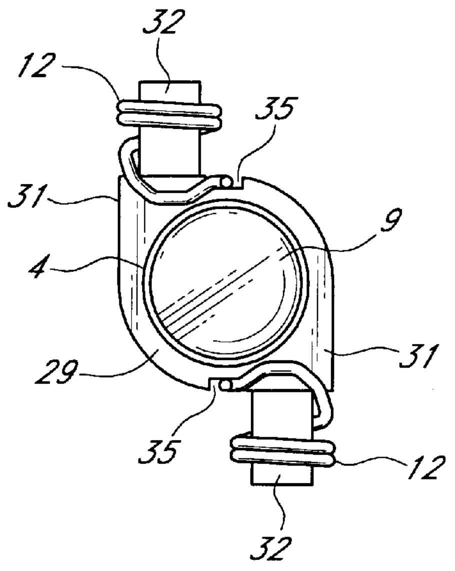
FIG. 27 is a plan view showing yet a further embodiment.
Figure 28:
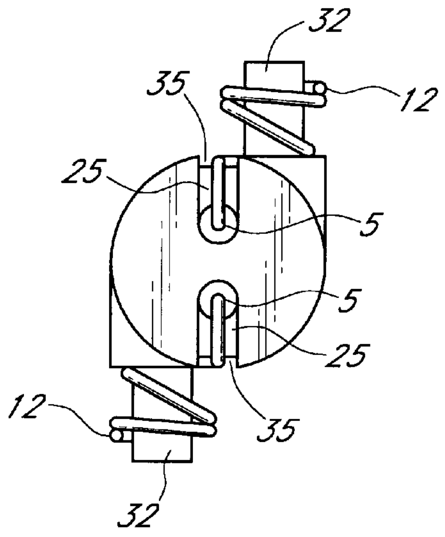
FIG. 28 is a bottom view of FIG. 27.

The printed wiring board 13 shown in FIG. 26 has an installing hole 28 permitting insertion of the socket 1 therein. The installing hole 28 has a circular hole portion 33 permitting insertion of the cylindrical bottomed holder 29 therein and cut portions 34 formed at symmetrical positions around the circular hole 33 to permit insertion of the fixing projections 30 therein. The lands 14 are formed on the back surface of the printed wiring board 13 and are connected electrically to portions of the lead wires 12 located at the upper surfaces of the lead-wire winding portions 32 by soldering. Either flow soldering means or reflow soldering means may be acceptable for the soldering. In case of soldering according to flow soldering means, the bottom of the socket 1 exposed to the outside through the rear surface of the printed wiring board 13 and the lead-wire winding portions 32 wound with the lead wires 12 are dipped in molter solder.

A description will now be given of an embodiment shown in FIGS. 27 to 30. A pair of flanges (projections) 31 are provided opposite to each other at completely symmetrical positions on the upper circumference of the cylindrical bottomed holder 29, and the lead-wire winding portions 32 made of an insulating and elastic member are formed on the flanges 31 as one to project in directions opposite to each other. A pair of lead-wire outlet holes 5 are formed in the bottom wall of the socket 1. Further, the lead-wire guide grooves 25 are formed on the bottom wall of the socket to extend from the lead-wire outlet holes 5 to the inside corners of base portions of the lead-wire winding portions 32. Lead-wire insertion grooves (recesses) 35 communicating with the lead-wire guide grooves 25 are formed on the circumference of the cylindrical bottomed holder 29 to extend to the inside corners of the base portions of the lead-wire winding portions 32.

The lead wires 12 drawn out to the lower surface of the socket 1 through the lead-wire outlet holes 5 are led to the upper surfaces of the lead-wire winding portions 32 through the lead-wire guide grooves 25 after the passage through the lead-wire insertion grooves 35 and, thereafter, are wound at least once around the lead-wire winding portions 32 from the upper surface side thereof.

Figure 29:
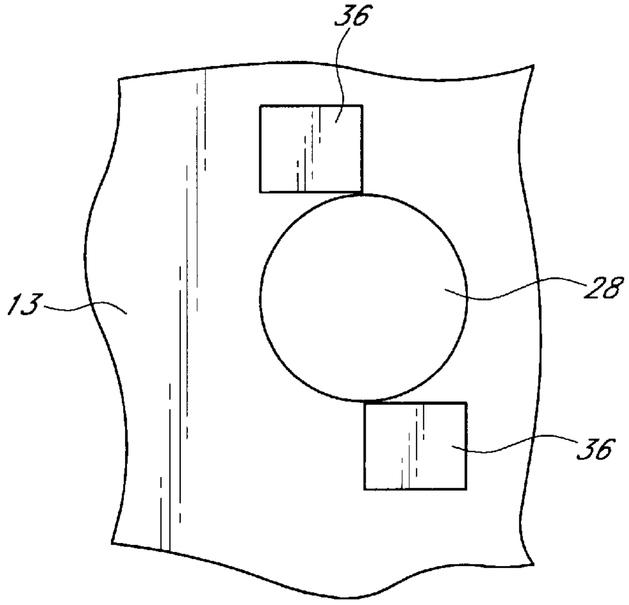
FIG. 29 is a view showing the surface of a printed wiring board.
Figure 30:
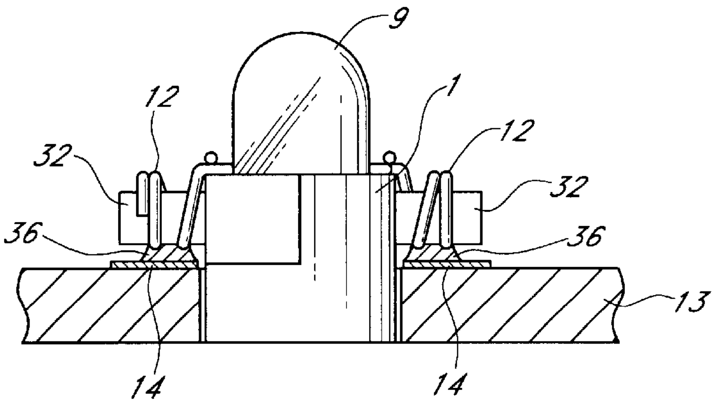
FIG. 30 is a side view for explaining the state of a lamp bulb device installed on a printed wiring board.

The lamp bulb device is installed on the printed wiring board 13. The printed wiring board 13 has an installing hole 28 for the socket 1 as shown in FIG. 29, and the lands 14 printed with cream solder 36 are provided on the surface of the printed wiring board. The lamp bulb device is installed on the printed wiring board such that the lands 14 correspond to the lead wire winding portions 32, that is, the terminals of the lamp bulb device, and portions of the lead wires 12 located at the lower surfaces of the lead-wire winding portions 32 are connected electrically to the lands 14 by means of reflow soldering. Soldering is not limited to soldering according to reflow soldering means; a soldering iron may also be used.

The present invention is effective in carrying out highly reliable soldering according to the shape of lead wires and soldering means. Further, since the bottom surface of the lamp bulb device is adapted for the soldered portion, the packaging density is improved.

Further, since the lamp bulb device is installed on the printed wiring board by soldering without using a method of putting the printed wiring board between the flanges and fixing projections or elastic pieces as in the prior art, the present invention is also effective in carrying out connection firmly and surely without shifting terminal positions of the lamp bulb device from predetermined positions.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A lamp bulb device installed on a circuit board, comprising:

a non-capped lamp bulb having lead wires, each lead wire having an end;

a base for supporting the non-capped lamp bulb and guiding the lead wires, comprising:

a cylindrical holder for supporting the non-capped lamp bulb, said cylindrical holder having an interior in which the non-capped lamp bulb is fitted;

a bottom portion of the cylindrical holder, said bottom portion having a lower surface on which lead-wire guide recesses are provided, said bottom having lead-wire outlet holes communicating with the interior of the cylindrical holder and the respective lead-wire guide recesses to draw out the lead wires through the lead-wire outlet holes and extend the lead wires over the respective lead-wire guide recesses on the lower surface, wherein the respective lead-wire outlet holes are aligned in a direction; and two square pole projections protruding outward from the bottom portion in a direction perpendicular to the direction of the lead-wire outlet holes alignment, said projections disposed opposite to each other, said lead-wire guide recesses being formed toward the respective projections, wherein rotation moment is exerted on the lamp bulb when the lead wires are drawn toward the respective projections along the respective lead-wire guide recesses;

wherein the lead wires from the non-capped lamp bulb are drawn out through the respective lead-wire outlet holes, and extended over respective lead-wire guide recesses and the respective projections, wherein the lead wires are placed at symmetrical positions with respect to the cylindrical holder and are wound multiple times around the respective projections, and a gap is formed between the wound lead wires and the respective projections, which gap is filled with a solder; and a circuit board having lands for electrically contacting the lead wires, wherein the lead wires placed on the projections are connected electrically to the lands by soldering, wherein the circuit board has a hole through which the cylindrical holder is fitted, and the lead wires placed on upper surfaces of the projections are connected electrically to the lands of the circuit board.

2. A lamp bulb device installed on a circuit board, comprising:

a non-capped lamp bulb having lead wires, each lead wire having an end;

a base for supporting the non-capped lamp bulb and guiding the lead wires, comprising:

a cylindrical holder for supporting the non-capped lamp bulb, said cylindrical holder having an interior in which the non-capped lamp bulb is fitted;

a bottom portion of the cylindrical holder, said bottom portion having a lower surface on which lead-wire guide recesses are provided, said bottom having lead-wire outlet holes communicating with the interior of the cylindrical holder and the respective lead-wire guide recesses to draw out the lead wires through the lead-wire outlet holes and extend the lead wires over the respective lead-wire guide recesses on the lower surface, wherein the receptive lead-wire outlet holes are aligned in a direction; and two square pole projections protruding outward from an upper portion of the cylindrical holder, said projections disposed in parallel and opposite to each other;

wherein the lead wires from the non-capped lamp bulb are drawn out through the respective lead-wire outlet holes, and extended over respective lead-wire guide recesses and the respective projections, wherein the lead wires are placed at symmetrical positions with respect to the cylindrical holder and are wound multiple times around the respective projections, and a gap is formed between the wound lead wires and the respective projections, which gap is filled with a solder; and a circuit board having lands for electrically contacting the lead wires, wherein the lead wires placed on the projections are connected electrically to the lands by soldering, wherein (i) the circuit board has a hole through which the bottom portion of the cylindrical holder is fitted, (ii) the lead wires pass through between the cylindrical holder and the hole of the circuit board, and (iii) the lead wires placed on lower surfaces of the projections are connected electrically to the lands of the circuit board.

* * * * *